US012765262B2

(12) United States Patent
Takeuchi et al.

(10) Patent No.: US 12,765,262 B2
(45) Date of Patent: Oct. 13, 2026

(54) PIEZOELECTRIC ELEMENT AND LIQUID DROPLET DISPENSING HEAD

(71) Applicant: SEIKO EPSON CORPORATION, Tokyo (JP)

(72) Inventors: Masahiro Takeuchi, Chino (JP); Yasuhiro Horiba, Shiojiri (JP); Yasuhiro Itayama, Kai (JP)

(73) Assignee: SEIKO EPSON CORPORATION (JP)

( * ) Notice: Subject to any disclaimer, the term of this patent is extended or adjusted under 35 U.S.C. 154(b) by 839 days.

(21) Appl. No.: 18/307,999

(22) Filed: Apr. 27, 2023

(65) Prior Publication Data

US 2023/0371385 A1 Nov. 16, 2023

(30) Foreign Application Priority Data

Apr. 28, 2022 (JP) ................................ 2022-074925

(51) Int. Cl.

| | |
|---|---|
| ***H01L 41/053*** | (2006.01) |
| ***B41J 2/14*** | (2006.01) |
| ***H10N 30/00*** | (2023.01) |
| ***H10N 30/853*** | (2023.01) |
| ***H10N 30/87*** | (2023.01) |

(52) U.S. Cl.

CPC ........ *H10N 30/708* (2024.05); *B41J 2/14233* (2013.01); *H10N 30/8542* (2023.02); *H10N 30/877* (2023.02)

(58) Field of Classification Search

CPC . H10N 30/708; H10N 30/8542; H10N 30/877
USPC .................................................. 310/324, 348
See application file for complete search history.

(56) References Cited

U.S. PATENT DOCUMENTS

| | | | | |
|---|---|---|---|---|
| 2008/0062228 A1* | 3/2008 | Saito | .................... | H10N 30/877 347/71 |
| 2012/0092423 A1 | 4/2012 | Mori | | |
| 2018/0233656 A1 | 8/2018 | Kitada et al. | | |
| 2018/0358540 A1 | 12/2018 | Kitada | | |

FOREIGN PATENT DOCUMENTS

| | | |
|---|---|---|
| JP | 2007-173690 A | 7/2007 |
| JP | 2012-084716 A | 4/2012 |
| JP | 2018133458 A | 8/2018 |
| JP | 2018-207064 A | 12/2018 |

* cited by examiner

*Primary Examiner* — Derek J Rosenau
(74) *Attorney, Agent, or Firm* — Harness, Dickey & Pierce, P.L.C.

(57) ABSTRACT

A piezoelectric element according to the present disclosure includes: a substrate; a first adhesion layer formed on the substrate and containing titanium; at least one of second adhesion layers formed on the substrate and containing titanium oxide; a first electrode formed on the first adhesion layer and the second adhesion layer; a seed layer formed on the first electrode and the substrate and containing titanium; a piezoelectric layer formed on the seed layer; and a second electrode formed on the piezoelectric layer. At least a part of an end portion of the first electrode is formed on the second adhesion layer.

8 Claims, 6 Drawing Sheets

B—B'

PIEZOELECTRIC ELEMENT AND LIQUID DROPLET DISPENSING HEAD

The present application is based on, and claims priority from JP Application Serial Number 2022-074925, filed Apr. 28, 2022, the disclosure of which is hereby incorporated by reference herein in its entirety.

BACKGROUND

1. Technical Field

The present disclosure relates to a piezoelectric element and a liquid droplet dispensing head.

2. Related Art

A piezoelectric element generally includes a substrate, a piezoelectric layer having an electromechanical conversion characteristic, and two electrodes sandwiching the piezoelectric layer. In recent years, development of devices (piezoelectric element application devices) using such a piezoelectric element as a driving source has been actively performed. One of the piezoelectric element application devices is a liquid ejection head represented by an ink jet recording head, a MEMS element represented by a piezoelectric MEMS element, an ultrasonic measurement device represented by an ultrasonic sensor, and further, a piezoelectric actuator device, and the like.

Lead zirconate titanate (PZT) is known as a material (piezoelectric material) for a piezoelectric layer of a piezoelectric element. In recent years, non-lead-based piezoelectric materials having a reduced lead content have been developed from the viewpoint of environmental loading reduction.

As one of the non-lead-based piezoelectric materials, for example, potassium sodium niobate (KNN; $(K,Na)NbO_3$) has been proposed as in JP-A-2018-133458.

Specifically, JP-A-2018-133458 discloses a piezoelectric element including an adhesion layer containing titanium provided between a substrate and a first electrode, and a thin-film piezoelectric layer made of a perovskite type composite oxide containing potassium, sodium, and niobium and provided between the first electrode and a second electrode.

As described above, the piezoelectric elements using the non-lead-based piezoelectric material such as piezoelectric elements (KNN-based piezoelectric elements) using potassium sodium niobate (KNN; $(K,Na)NbO_3$) have been proposed. As in the piezoelectric element disclosed in JP-A-2018-133458, in the related art, in order to improve adhesion between the substrate and the lower electrode, it is known to form a film of titanium or titanium oxide on the lower electrode as the adhesion layer.

However, in a case of piezoelectric element in which the lower electrode is formed on the adhesion layer, titanium constituting the adhesion layer may diffuse into the lower electrode in a process of forming the piezoelectric layer on the lower electrode. In particular, at an end portion of the lower electrode, diffusion of titanium into the lower electrode creates a gap between the lower electrode and the substrate, which may cause peeling or cracking of the lower electrode. When the crack reaches an upper electrode, a leakage current may occur. As the piezoelectric element is driven, stress is concentrated on the crack, and the piezoelectric element may be damaged.

Under such a circumstance, a piezoelectric element capable of preventing peeling of the lower electrode is required.

Such a problem is not limited to a piezoelectric element used in a piezoelectric actuator mounted on a liquid ejection head represented by an ink jet recording head, but similarly in a piezoelectric element used in another piezoelectric element application device.

SUMMARY

In order to solve the above-described problem, one aspect of the present disclosure provides a piezoelectric element including: a substrate; a first adhesion layer formed on the substrate and containing titanium; at least one of second adhesion layers formed on the substrate and containing titanium oxide; a first electrode formed on the first adhesion layer and the second adhesion layer; a seed layer formed on the first electrode and the substrate and containing titanium; a piezoelectric layer formed on the seed layer; and a second electrode formed on the piezoelectric layer. At least a part of an end portion of the first electrode is formed on the second adhesion layer.

Another aspect of the present disclosure provides a liquid droplet dispensing head including: a nozzle plate in which a nozzle configured to dispense a liquid as a liquid droplet is formed; a pressure chamber coupled to the nozzle; a flow path forming substrate disposed on the nozzle plate and forming a part of a wall surface of the pressure chamber; a vibration plate forming a part of the wall surface of the pressure chamber; the piezoelectric element according to claim 1 or 2 formed on the vibration plate; and a voltage application unit configured to apply a voltage to the piezoelectric element. A plurality of the piezoelectric elements are provided on the substrate.

DESCRIPTION OF EXEMPLARY EMBODIMENTS

Figure 1:
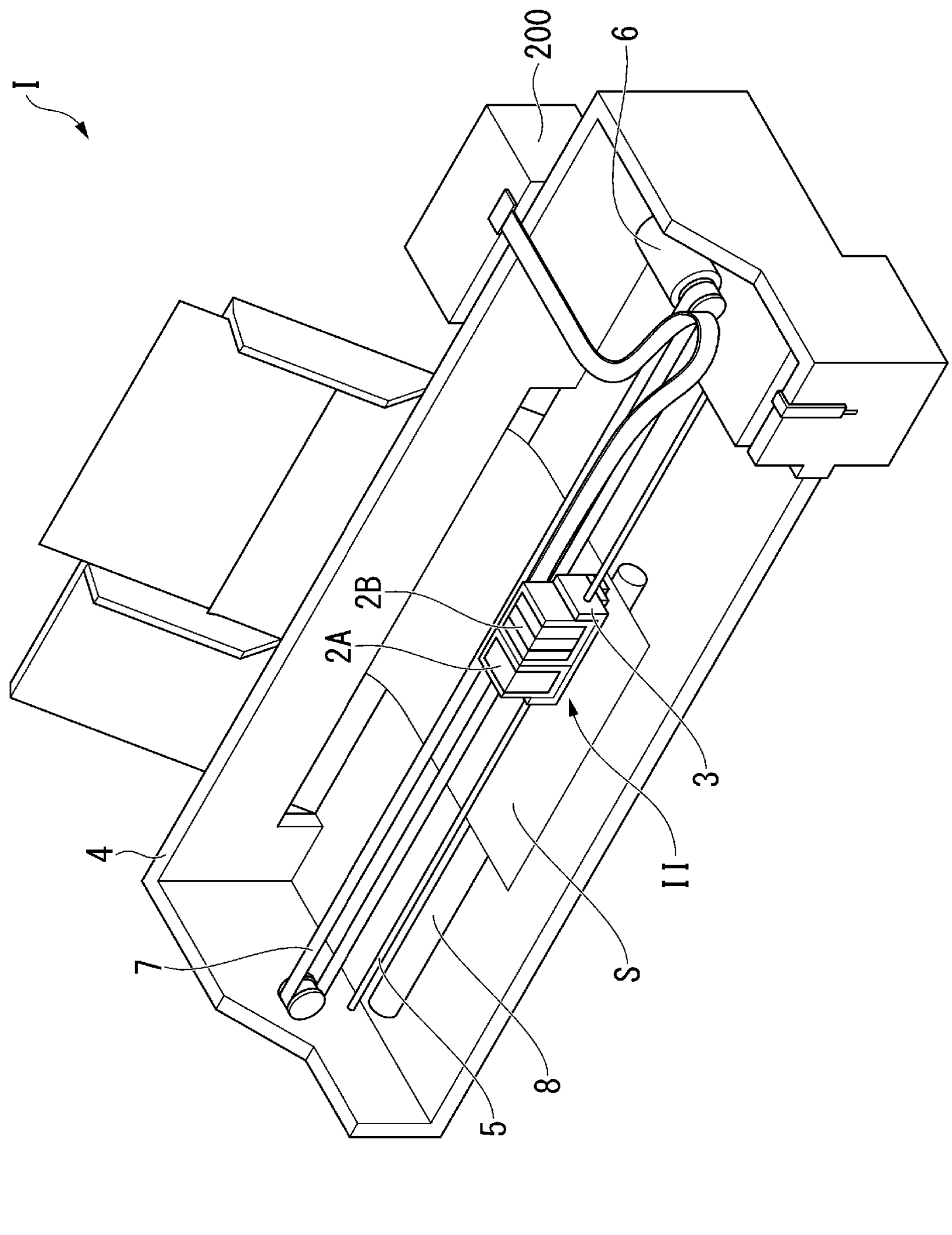
FIG. 1 is a perspective view showing a schematic configuration of a recording device according to a first embodiment.

Hereinafter, an embodiment of the present disclosure will be described with reference to the drawings. The following description shows an aspect of the present disclosure, and can be freely changed without departing from the gist of the present disclosure. In the drawings, the same reference signs denote the same members, and the description thereof is omitted as appropriate. The number after a letter which makes up the reference sign is referenced by a reference sign which includes the same letter and is used to distinguish between elements which have similar configurations. When it is not necessary to distinguish elements indicated by the reference signs which include the same letter from each other, each of the elements is referenced by a reference sign containing only a letter.

In each drawing, X, Y, and Z represent three spatial axes orthogonal to one another. In the present description, directions along these axes are referred to as a first direction X (an X-direction), a second direction Y (a Y-direction), and a third direction Z (a Z-direction), respectively, a direction of an arrow in each drawing is referred to as a positive (+) direction, and a direction opposite from the arrow is referred to as a negative (−) direction. The X-direction and the Y-direction represent in-plane directions of a plate, a layer, and a film, and the Z-direction represents a thickness direction or a stacking direction of a plate, a layer, and a film.

Components shown in each drawing, that is, a shape and size of each part, a thickness of a plate, a layer, and a film, a relative positional relation, a repeating unit, and the like may be exaggerated for describing the present disclosure. Furthermore, the term "above" in the present description does not limit that a positional relation between the components is "directly above". For example, expressions such as "a first electrode on a substrate" and "a piezoelectric layer on the first electrode", which will be described later, do not exclude those including other components between the substrate and the first electrode or between the first electrode and the piezoelectric layer.

Liquid Droplet Dispensing Head

First, an ink jet recording device, which is an example of a liquid ejection device including a liquid droplet dispensing head according to the embodiment of the present disclosure, will be described with reference to the drawings. FIG. 1 is a perspective view showing a schematic configuration of the ink jet recording device.

As shown in FIG. 1, in an ink jet recording device (a recording device) I, an ink jet recording head unit (a head unit) II is detachably provided in cartridges 2A and 2B. The cartridges 2A and 2B constitute an ink supply unit. The head unit II includes a plurality of ink jet recording heads (liquid droplet dispensing heads) 1 (see FIG. 2 and the like) to be described later, and is mounted on a carriage 3. The carriage 3 is movable in an axial direction on a carriage shaft 5 attached to a device main body 4. The head unit II and the carriage 3 can dispense, for example, a black ink composition and a color ink composition.

A driving force of a drive motor 6 is transmitted to the carriage 3 via a plurality of gears (not shown) and a timing belt 7, so that the carriage 3 on which the head unit II is mounted is moved along the carriage shaft 5. On the other hand, the device main body 4 is provided with a conveyance roller 8 as a conveyance unit, and a recording sheet S which is a recording medium such as paper is conveyed by the conveyance roller 8. The conveyance unit which conveys the recording sheet S is not limited to the conveyance roller, and may be a belt, a drum, or the like.

In each of the recording heads 1, a piezoelectric element 300 (see FIG. 2 and the like), which will be described in detail later, is used as a piezoelectric actuator device. By using the piezoelectric element 300, it is possible to avoid deterioration various characteristics (durability, ink ejection characteristics, and the like) in the recording device I.

Figure 2:
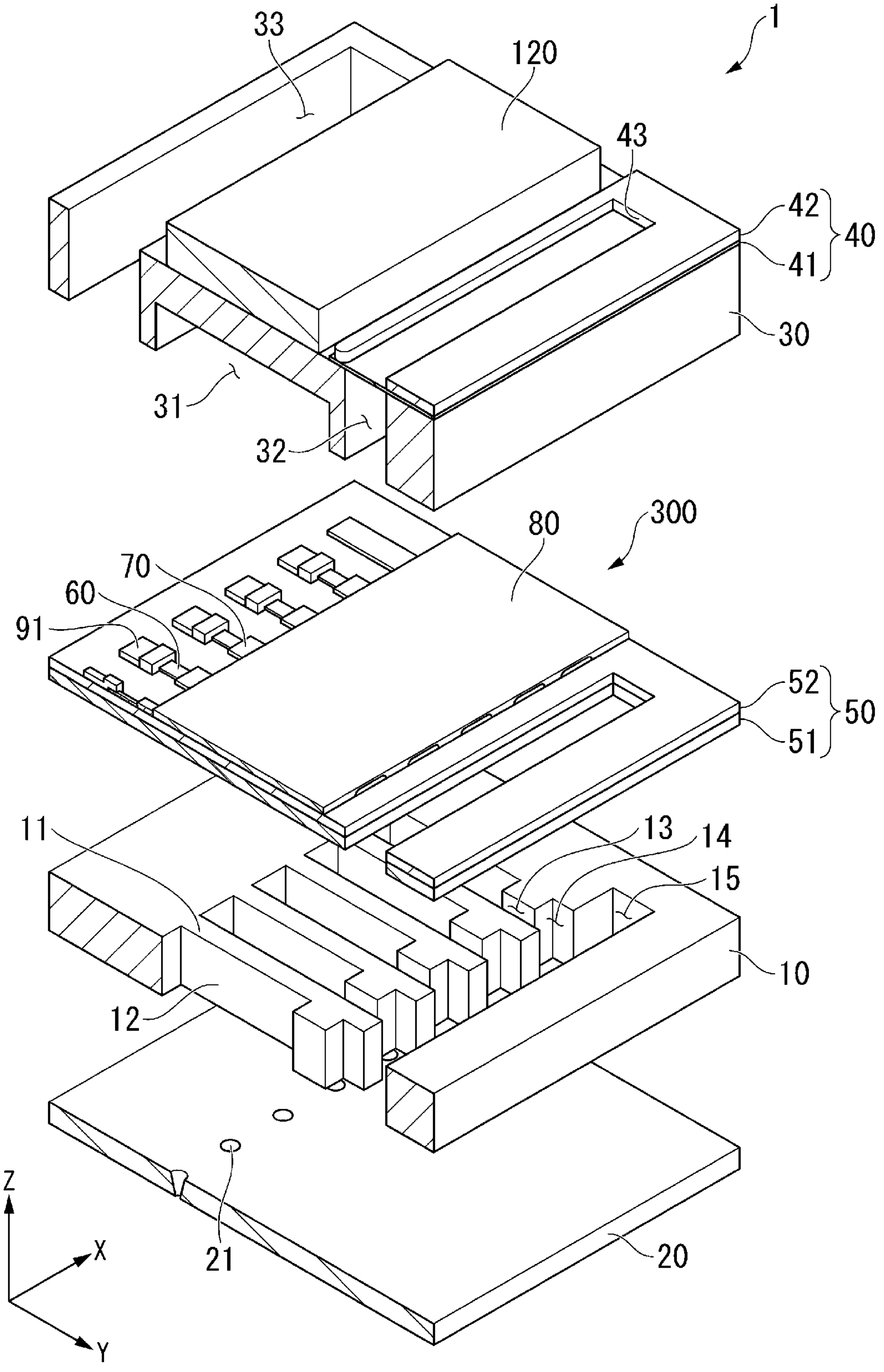
FIG. 2 is an exploded perspective view of a liquid droplet dispensing head of the recording device in FIG. 1.
Figure 3:
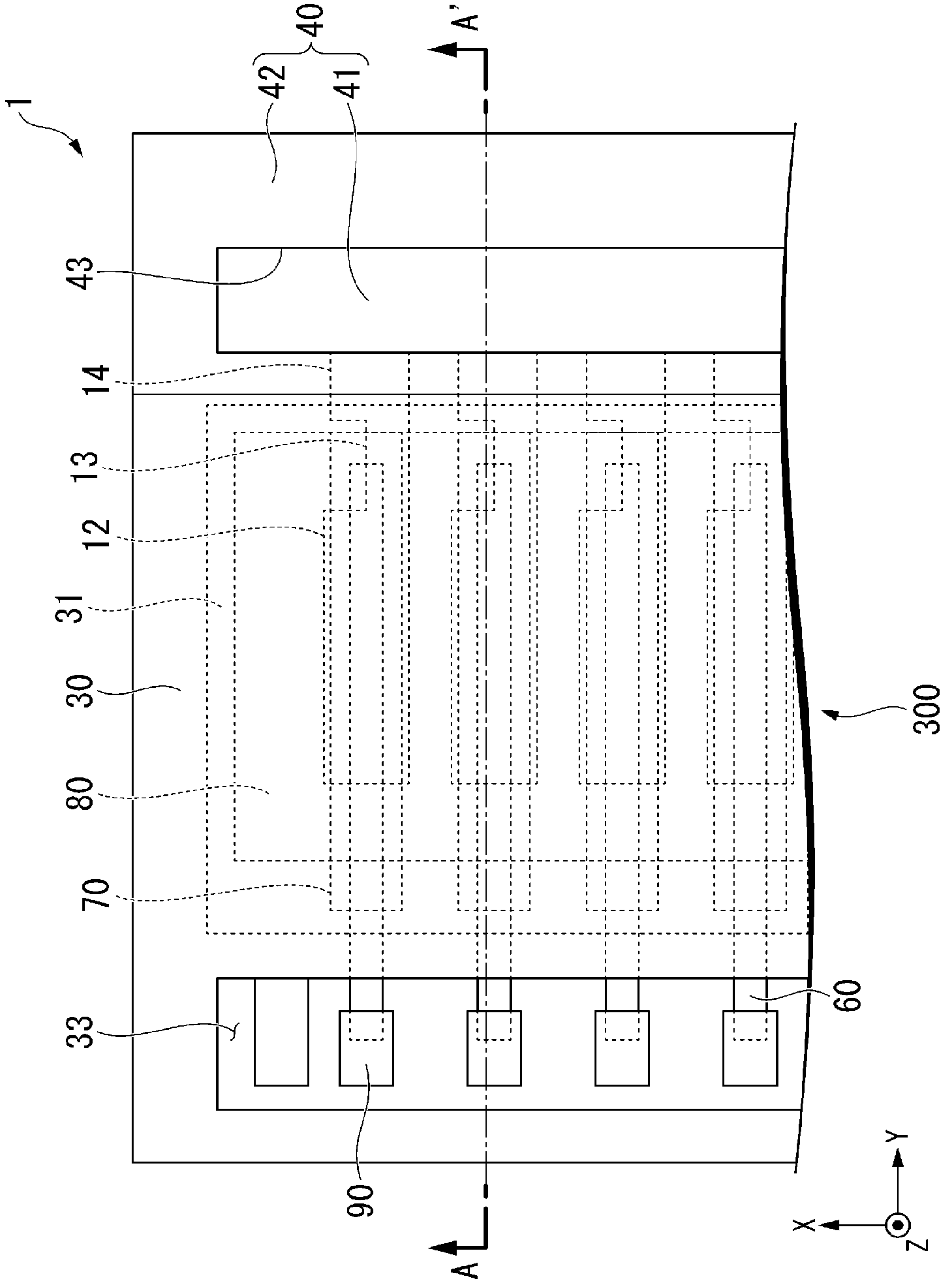
FIG. 3 is a plan view of the liquid droplet dispensing head of the recording device in FIG. 1.
Figure 4:
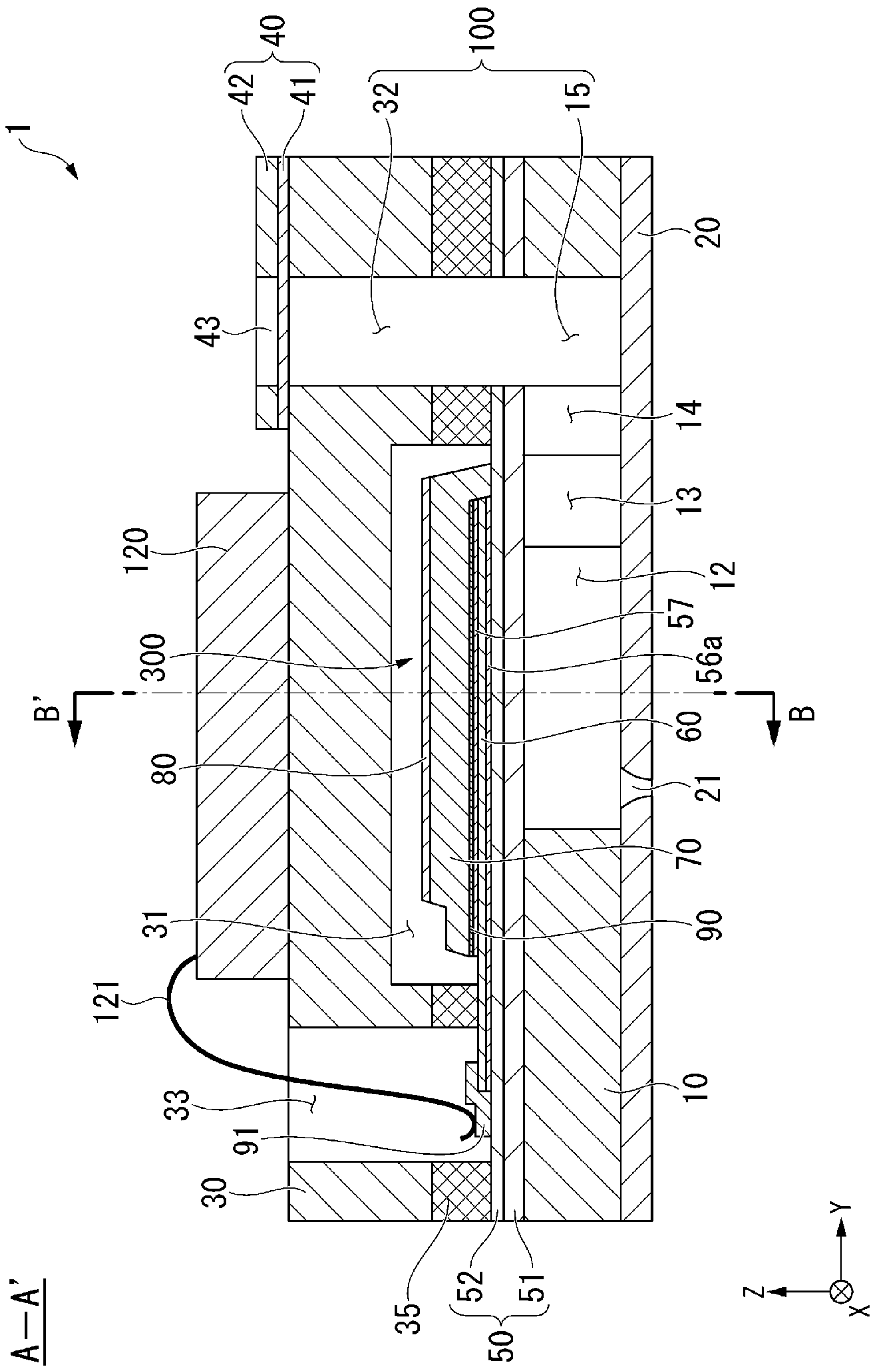
FIG. 4 is a cross-sectional view of the liquid droplet dispensing head of the recording device in FIG. 1.

Next, the liquid droplet dispensing head 1, which is an example of a liquid ejection head mounted on the liquid ejection device, will be described with reference to the drawings. FIG. 2 is an exploded perspective view showing a schematic configuration of the liquid droplet dispensing head. FIG. 3 is a plan view showing the schematic configuration of the liquid droplet dispensing head. FIG. 4 is a cross-sectional view taken along a line A-A' in FIG. 3. FIGS. 2 to 4 each show a part of a configuration of the recording head 1, and are omitted as appropriate.

As shown in the drawing, a flow path forming substrate (a substrate) 10 contains silicon (Si). For example, the substrate 10 is made of a silicon (Si) single crystal substrate.

Pressure generation chambers (pressure chambers) 12 partitioned by a plurality of partition walls 11 are formed in the substrate 10. The pressure generation chambers 12 are arranged side by side along a direction (a +X direction) in which a plurality of nozzle openings 21 for dispensing an ink of the same color are arranged side by side.

In the substrate 10, an ink supply path 13 and a communication path 14 are formed at one end portion side (a +Y direction side) of each of the pressure generation chambers 12. Each of the ink supply paths 13 is formed such that an area of an opening on the one end portion side of the pressure generation chamber 12 is reduced. Each of the communication paths 14 has substantially the same width as the pressure generation chamber 12 in the +X direction. A communication portion 15 is formed at an outer side (the +Y direction side) of the communication path 14. The communication portion 15 constitutes a part of a manifold 100. The manifold 100 serves as a common ink chamber for each pressure generation chamber 12. Therefore, a liquid flow path including the pressure generation chamber 12, the ink supply path 13, the communication path 14, and the communication portion 15 is formed in the substrate 10.

A nozzle plate 20 made of, for example, SUS is bonded to one surface (a surface on a −Z-direction side) of the substrate 10. In the nozzle plate 20, the nozzle openings 21 are arranged side by side along the +X direction. The nozzle openings 21 communicate with the pressure generation chambers 12. The nozzle plate 20 can be bonded to the substrate 10 by an adhesive, a thermal welding film, or the like.

A vibration plate 50 is formed on the other surface (a surface on a +Z direction side) of the substrate 10. The vibration plate 50 includes, for example, an elastic film 51 formed on the substrate 10 and an insulator film (a diffusion inhibition layer) 52 formed on the elastic film 51. The elastic film 51 is made of, for example, silicon dioxide ($SiO_2$), and the diffusion inhibition layer 52 is made of, for example, zirconium oxide ($ZrO_2$).

Figure 5:
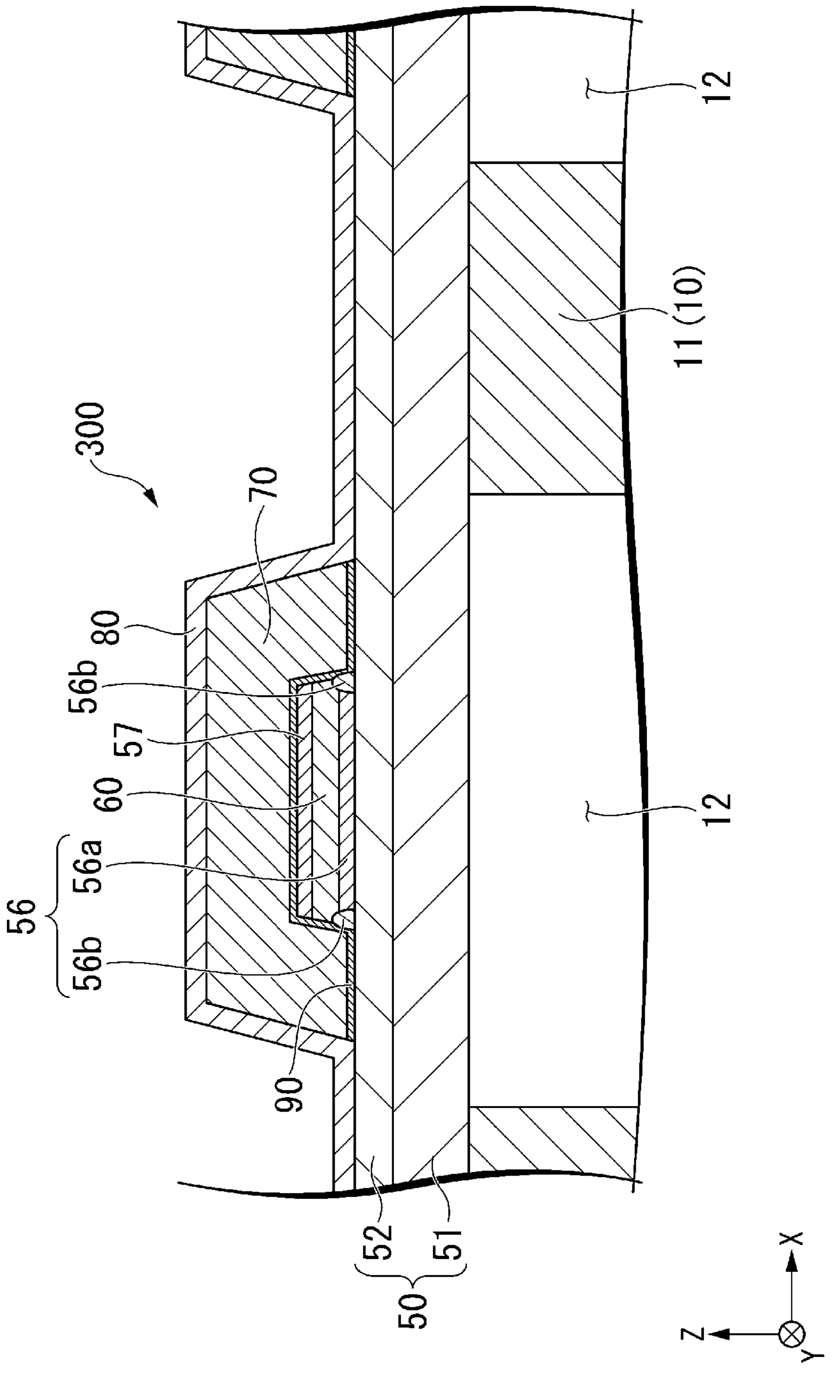
FIG. 5 is an enlarged cross-sectional view taken along a line B-B' in FIG. 4.

The elastic film 51 may not be a separate member from the substrate 10. A part of a surface layer (including a surface) on the +Z direction side of the substrate 10 may be processed to be thin and used as the elastic film 51. In the present specification, one or both of the substrate 10 and the vibration plate 50 may be simply referred to as a "substrate". The vibration plate 50 may be regarded as a "substrate". In FIG. 5 to be described later, an example in which the elastic film 51 and the diffusion inhibition layer 52 are stacked on a surface on the other surface (the surface on the +Z direction side) side of the substrate 10 is shown, and the substrate 10 and the elastic film 51 may be integrated.

First electrodes 60, piezoelectric layers 70, and a second electrode 80 are sequentially formed on the diffusion inhibition layer 52 and the substrate (the substrate 10 and/or the vibration plate 50) via an adhesion layer 56. The adhesion layer 56 is made of, for example, titanium oxide ($TiO_x$), or titanium (Ti), and has a function of improving adhesion between the piezoelectric layer 70 and the vibration plate 50. Details of the adhesion layer 56 will be described later.

The first electrode 60 is provided for each pressure generation chamber 12. That is, the first electrode 60 is provided as an individual electrode that is independent for each pressure generation chamber 12. The first electrode 60 has a width smaller than a width of the pressure generation chamber 12 in ±X directions. The first electrode 60 has a width larger than the width of the pressure generation chamber 12 in ±Y directions. That is, in the #Y directions, both end portions of the first electrode 60 are formed up to an outside of a region on the vibration plate 50 facing the pressure generation chamber 12. A lead electrode 91 is coupled to one end portion side (an opposite side from the communication path 14) of the first electrode 60.

A conductive oxide layer 57 may be provided between the first electrode 60 and the piezoelectric layer 70 (see FIG. 5). The conductive oxide layer 57 has a function of controlling orientation of crystals of a piezoelectric body constituting the piezoelectric layer 70. That is, by providing the conductive oxide layer 57, the crystals of the piezoelectric body constituting the piezoelectric layer 70 can be preferentially oriented in a predetermined plane orientation. The conductive oxide layer 57 is made of, for example, a material containing iridium.

A seed layer (an orientation control layer) 90 is provided between the first electrode 60 and the piezoelectric layer 70. The seed layer has a function of controlling the orientation of the crystals of the piezoelectric body constituting the piezoelectric layer 70. That is, by providing the seed layer 90, the crystals of the piezoelectric body constituting the piezoelectric layer 70 can be preferentially oriented in the predetermined plane orientation. The seed layer 90 is made of a material containing titanium.

The piezoelectric layer 70 is provided between the first electrode 60 and the second electrode 80. The piezoelectric layer 70 is a thin-film piezoelectric body. The piezoelectric layer 70 has a width larger than the width of the first electrode 60 in the ±X directions. The piezoelectric layer 70 has, in the ±Y directions, a width larger than the length of the pressure generation chamber 12 in the ±Y directions. An end portion of the piezoelectric layer 70 on an ink supply path 13 side (the +Y direction side) is formed up to an outside of an end portion of the first electrode 60 on the +Y direction side. That is, the end portion of the first electrode 60 on the +Y direction side is covered with the piezoelectric layer 70. On the other hand, an end portion of the piezoelectric layer 70 on a lead electrode 91 side (the −Y direction side) is on an inner side (the +Y direction side) of an end portion of the first electrode 60 on the −Y direction side. That is, the end portion of the first electrode 60 on the −Y direction side is not covered with the piezoelectric layer 70.

The second electrode 80 is continuously provided on the piezoelectric layer 70 and the vibration plate 50 over the +X direction. That is, the second electrode 80 is implemented as a common electrode common to the plurality of piezoelectric layers 70. In the embodiment, the first electrode 60 constitutes an individual electrode independently provided corresponding to the pressure generation chamber 12, and the second electrode 80 constitutes a common electrode continuously provided in a direction in which the pressure generation chambers 12 are arranged side by side. Alternatively, the first electrode 60 may constitute the common electrode, and the second electrode 80 may constitute the individual electrode.

In the embodiment, the vibration plate 50 and the first electrode 60 are displaced by displacement of the piezoelectric layer 70 having the electromechanical conversion characteristics. That is, the vibration plate 50 and the first electrode 60 substantially function as the vibration plate. However, in practice, since the second electrode 80 is also displaced due to the displacement of the piezoelectric layer 70, a region in which the vibration plate 50, the first electrode 60, the piezoelectric layer 70, and the second electrode 80 are sequentially stacked functions as a movable portion (also referred to as a vibration portion) of the piezoelectric element 300.

On the substrate 10 (the vibration plate 50) on which the piezoelectric element 300 is formed, a protective substrate 30 is bonded by an adhesive 35. The protective substrate 30 has a manifold portion 32. At least a portion of the manifold 100 is implemented by the manifold portion 32. The manifold portion 32 according to the embodiment penetrates the protective substrate 30 in the thickness direction (the Z direction), and is further formed over a width direction (+X direction) of the pressure generation chamber 12. Further, the manifold portion 32 communicates with the communication portion 15 of the substrate 10. With this configuration, the manifold 100 which is an ink chamber common to the pressure generation chambers 12 is formed.

The protective substrate 30 has a piezoelectric element holding portion 31 formed in a region including the piezoelectric element 300. The piezoelectric element holding portion 31 has enough space not to interfere with a movement of the piezoelectric element 300. This space may or may not be sealed. The protective substrate 30 is provided with a through hole 33 penetrating the protective substrate 30 in the thickness direction (the Z direction). An end portion of each of the lead electrodes 91 is exposed in the through hole 33.

Examples of a material for the protective substrate 30 include Si, SOI, glass, a ceramic material, a metal, and a resin, and it is more preferable that the protective substrate 30 is formed of a material having substantially the same thermal expansion coefficient as that of the substrate 10.

A drive circuit 120 functioning as a signal processing unit is fixed on the protective substrate 30. As the drive circuit 120, for example, a circuit board or a semiconductor integrated circuit (IC) can be used. The drive circuit 120 and the lead electrode 91 are electrically coupled to each other via a coupling wiring 121 made of a conductive wire such as a bonding wire inserted through the through hole 33. The drive circuit 120 can be electrically coupled to a printer controller 200 (see FIG. 1). Such a drive circuit 120 functions as a control unit for the piezoelectric actuator device (the piezoelectric element 300).

On the protective substrate 30, a compliance substrate 40 including a sealing film 41 and a fixing plate 42 is bonded. The sealing film 41 is made of a material having low rigidity, and the fixing plate 42 can be made of a hard material such as a metal. A region of the fixing plate 42 facing the manifold 100 is an opening 43 with a part completely removed in the thickness direction (the Z direction). One surface (the surface on the +Z direction side) of the manifold 100 is sealed only with the sealing film 41 having flexibility.

Such a liquid droplet dispensing head 1 dispenses ink droplets by the following operation.

First, an ink is taken in from an ink introduction port coupled to an external ink supply unit (not shown), and an inside of the liquid droplet dispensing head 1 is filled with the ink from the manifold 100 to the nozzle openings 21. Thereafter, according to a recording signal from the drive circuit 120, a voltage is applied between the first electrode 60 and the second electrode 80 corresponding to each pressure generation chamber 12, and the piezoelectric element 300 is deflected and deformed. Accordingly, a pressure in each pressure generation chamber 12 is increased, and the ink droplets are dispensed from the nozzle openings 21.

Piezoelectric Element

Next, a configuration of the piezoelectric element 300 in the liquid droplet dispensing head 1 used as the piezoelectric actuator device will be described with reference to the drawings.

Figure 6:
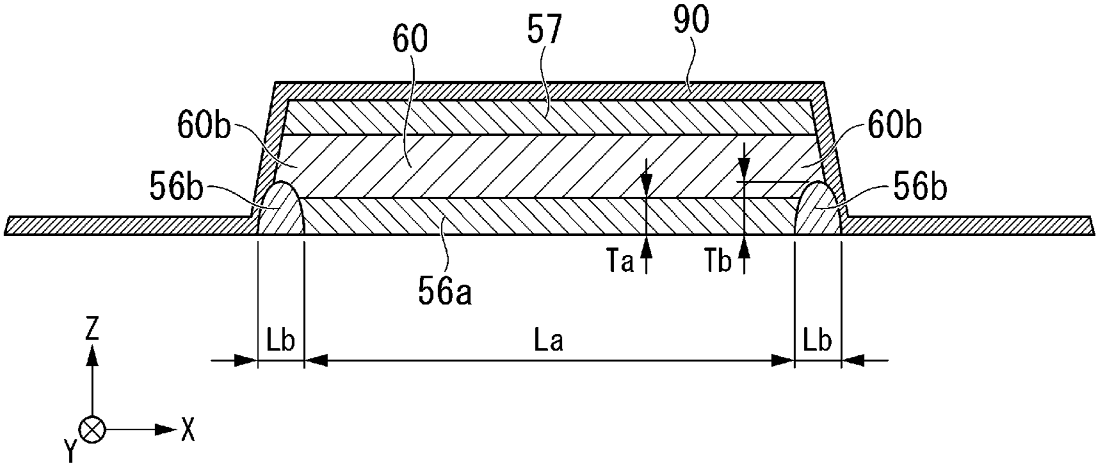
FIG. 6 is an enlarged cross-sectional view of a piezoelectric element in FIG. 5.

FIG. 5 is an enlarged cross-sectional view taken along a line B-B' in FIG. 4. FIG. 6 is an enlarged cross-sectional view of the piezoelectric element 300 in FIG. 5. As shown in FIGS. 5 and 6, the piezoelectric element 300 includes the substrate 10, a first adhesion layer **56*a* formed on the substrate 10 and containing titanium, at least one of second adhesion layers 56*b* formed on the substrate 10 and containing titanium oxide, the first electrode 60 formed on the first adhesion layer 56*a* and the second adhesion layer 56*b*, the seed layer 90 formed on the first electrode 60 and the substrate 10 and containing titanium, the piezoelectric layer 70 formed on the seed layer 90, and the second electrode 80 formed on the piezoelectric layer 70. At least part of an end portion of the first electrode 60 is formed on the second adhesion layer 56*b***.

The piezoelectric element 300 overlaps the pressure generation chamber (the pressure chamber) 12 in a plan view. As shown in FIG. 5, the piezoelectric element 300 includes the adhesion layer 56, the first electrode 60, the seed layer 90, the piezoelectric layer 70, and the second electrode 80, which are stacked in this order in the Z direction. Therefore, in the piezoelectric element 300, the adhesion layer 56, the first electrode 60, the seed layer 90, the piezoelectric layer 70, and the second electrode 80 are stacked on the substrate 10 in this order.

The substrate 10 is provided with the pressure generation chambers 12 partitioned by the plurality of partition walls 11. With such a configuration, the movable portion of the piezoelectric element 300 is formed.

The vibration plate 50 is provided on the substrate 10. The vibration plate 50 includes the elastic film 51 and the diffusion inhibition layer 52.

The elastic film 51 is made of, for example, silicon dioxide ($SiO_2$), and the diffusion inhibition layer 52 is made of, for example, zirconium oxide ($ZrO_2$).

The diffusion inhibition layer 52 is disposed between the substrate 10 and the seed layer 90 and between the substrate 10 and the adhesion layer 56 in the Z direction. The diffusion inhibition layer 52 is made of an insulating material. The diffusion inhibition layer 52 is preferably made of, for example, an insulating material containing zirconium. By using a material containing zirconium as the diffusion inhibition layer 52, it is possible to further reduce diffusion of an alkali metal contained in the piezoelectric layer 70 to a substrate 10 side. From such a viewpoint, the diffusion inhibition layer 52 more preferably contains zirconium oxide ($ZrO_2$). The diffusion inhibition layer 52 may contain only zirconium oxide ($ZrO_2$).

On the diffusion inhibition layer 52, the first electrodes 60, the piezoelectric layers 70, and the second electrodes 80 are formed in this order via the adhesion layer 56.

As shown in FIG. 5, the adhesion layer 56 includes the first adhesion layer **56*a* and the second adhesion layer 56*b* provided adjacent to at least one of the end portions of the first adhesion layer 56*a* in the width direction (the direction). That is, the second adhesion layer 56*b* is provided below at least one end portion of the first electrode 60 in the width direction (the X direction). Although FIGS. 5 and 6 show an example in which the second adhesion layers 56*b* are provided at both end portions of the first electrode 60 in the width direction, the piezoelectric element 300 according to the embodiment is not limited to this configuration. For example, the second adhesion layer 56*b* may be provided at one end portion of the first electrode 60** in the width direction.

The first adhesion layer **56*a* is made of, for example, metallic titanium (Ti) and has a function of improving adhesion between the first electrode 60 and the vibration plate 50. On the other hand, the second adhesion layer 56*b* is made of, for example, titanium oxide ($TiO_x$), and has a function of reducing diffusion of titanium constituting the first adhesion layer 56*a* into the first electrode 60. Metallic titanium is known as an element that easily diffuses. For this reason, while metallic titanium is a suitable material as the adhesion layer, metallic titanium is easily diffused to the periphery. Therefore, characteristics of peripheral elements may be changed. In this case, by providing the second adhesion layer 56*b* containing titanium oxide ($TiO_x$) on an end portion side of the first adhesion layer 56*a* that mainly functions as the adhesion layer, it is possible to reduce the diffusion of metallic titanium in the first adhesion layer 56*a*** to the periphery.

An average thickness Ta of the first adhesion layer **56*a* is not particularly limited, and is preferably 5 nm or more from the viewpoint of ensuring adhesion. The average thickness is more preferably 20 nm or more. On the other hand, when the average thickness Ta of the first adhesion layer 56*a* is excessively large, an amount of diffusion of titanium to the periphery (in particular, a first electrode 60 side) increases, and titanium oxide may aggregate between the first electrode 60 and the piezoelectric layer 70. When titanium oxide aggregates between the first electrode 60 and the piezoelectric layer 70, peeling may occur in this region. Therefore, the thickness Ta of the first adhesion layer 56*a*** is preferably 100 nm or less. The thickness is more preferably 80 nm or less.

A maximum thickness Tb of the second adhesion layer **56*b* is preferably smaller than the average thickness Ta of the first adhesion layer 56*a*. That is, the average thickness Ta of the first adhesion layer 56*a* is preferably smaller than the maximum thickness Tb of the second adhesion layer 56*b*. As described above, the second adhesion layer 56*b* has a function of reducing the diffusion of titanium constituting the first adhesion layer 56*a* into the first electrode 60. By providing the second adhesion layer 56*b* on the end portion side of the first adhesion layer 56*a*, it is possible to prevent the diffusion of titanium constituting the first adhesion layer 56*a* into a piezoelectric layer 70 side (the X direction). In order to further enjoy this effect, the maximum thickness Tb of the second adhesion layer 56*b* is preferably larger than the average thickness Ta of the first adhesion layer 56*a***.

A width La of the first adhesion layer **56*a* is preferably larger than a total value of widths Lb of the second adhesion layer 56*b*. As described above, the first adhesion layer 56*a* containing metallic titanium has a function of improving the adhesion between the first electrode 60 and the vibration plate 50. On the other hand, the second adhesion layer 56*b* containing titanium oxide has an excellent element diffusion inhibition function, whereas the adhesion thereof is lower than that of the first adhesion layer 56*a*. Therefore, in order to ensure sufficient adhesion between the first electrode 60 and the vibration plate 50, the width La of the first adhesion layer 56*a* is preferably larger than the total value of the widths Lb of the second adhesion layer 56*b***.

Here, the "width La of the first adhesion layer **56*a*" refers to a width (a minimum distance) in the X direction on a short side of the first electrode 60. The "width Lb of the second adhesion layer 56*b*" refers to a width (a maximum distance) in the X direction on the short side of the first electrode 60**.

The second adhesion layer 56*b* contains titanium oxide ($TiO_x$) as described above, and may contain, for example, iron (Fe) or potassium (K) in addition to titanium and oxygen. The second adhesion layer 56*b* will be described in detail in a manufacturing method to be described later, and can be obtained by forming a titanium film and a first electrode film on the vibration plate 50, applying a solution serving as a seed layer, and performing an annealing treatment in an oxidizing atmosphere to oxidize a part of the titanium film. Further, thereafter, the piezoelectric layer 70 can be formed by applying, for example, a KNN-based material and further performing the annealing treatment. At this time, iron (Fe) in a solution serving as the seed layer and a part of potassium (K) in the KNN-based material may move to the second adhesion layer 56*b*. That is, iron (Fe) considered to be derived from the seed layer and potassium (K) considered to be derived from the KNN-based material may be contained in the second adhesion layer 56*b*. A distribution of elements such as iron and potassium can be observed by SEM and element distribution analysis (element mapping). A mechanism by which iron and potassium move to the second adhesion layer 56*b* is not clear, but it is considered that iron and potassium have an effect of promoting formation of oxide during the annealing treatment of the titanium film in the oxidizing atmosphere.

The first electrode 60 is provided on the first adhesion layer 56*a* and the second adhesion layer 56*b*. The first electrode 60 is provided between the adhesion layer 56 and the seed layer 90. A shape of the first electrode 60 is, for example, a layered shape. A thickness of the first electrode 60 is, for example, 10 nm or more and 200 nm or less. The first electrode 60 is, for example, a metal layer such as a platinum (Pt) layer, a gold (Au) layer, an iridium (Ir) layer, or a ruthenium (Ru) layer, a conductive oxide layer thereof, a lanthanum nickelate ($LaNiO_3$:LNO) layer, or a strontium ruthenate ($SrRuO_3$:SRO) layer. The first electrode 60 may have a structure in which the plurality of layers exemplified above are stacked.

The first electrode 60 is a lower electrode provided below the piezoelectric layer 70 for applying a voltage to the piezoelectric layer 70. As shown in FIGS. 5 and 6, the first electrode 60 may have an inclined portion (a tapered portion) inclined from end portions of an upper surface of the first electrode 60 toward the second adhesion layer 56*b* and the vibration plate 50. When the first electrode 60 has the inclined portion, the second adhesion layer 56*b* is disposed below the inclined portion, and the width Lb of the second adhesion layer 56*b* at this time is preferably larger than the width of the inclined portion in the X direction. With such a configuration, diffusion of titanium in the first adhesion layer 56*a* to the periphery can be further reduced.

The piezoelectric layer 70 is provided on the substrate 10 via the seed layer 90. The piezoelectric layer 70 is provided between the first electrode 60 and the second electrode 80. As shown in FIG. 5, the piezoelectric layer 70 is provided individually for the plurality of piezoelectric elements 300. A form of the piezoelectric layer 70 is not limited to that in FIG. 5, and may be, for example, a band shape extending continuously over the plurality of piezoelectric elements 300.

A thickness of the piezoelectric layer 70 is, for example, 100 nm or more and 5 μm or less. The piezoelectric layer 70 can be deformed by applying a voltage between the first electrode 60 and the second electrode 80.

The piezoelectric layer 70 is formed by a solution method (also referred to as a liquid phase method or a wet method) such as a MOD method or a sol-gel method, or a gas phase method such as a sputtering method. The piezoelectric layer 70 according to the embodiment is preferably a perovskite type composite oxide represented by a general formula $ABO_3$ containing potassium (K), sodium (Na), and (Nb). That is, the piezoelectric layer 70 niobium preferably contains a piezoelectric material made of a KNN-based composite oxide represented by the following formula (1).

$$(K_x,Na_{1-x})NbO_3 \quad (1)$$

$$(0.1 \le X \le 0.9)$$

The piezoelectric material constituting the piezoelectric layer 70 is preferably a KNN-based composite oxide, and is not limited to the composition represented by the formula (1). For example, another metal element (an additive) may be contained in an A site or a B site of potassium sodium niobate. Examples of such additives include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn) and copper (Cu).

One or more additives of this kind may be contained. In general, an amount of the additives is 20% or less, preferably 15% or less, and more preferably 10% or less with respect to a total amount of elements serving as a main component. By using the additive, it is easy to improve various characteristics to diversify the configuration and function, but it is preferable that a KNN content is more than 80% from the viewpoint of exhibiting characteristics derived from the KNN. Also in the case of a composite oxide containing other elements, it is preferable that the composite oxide has an $ABO_3$ type perovskite structure.

In the present specification, the "perovskite type composite oxide containing K, Na, and Nb" is a "composite oxide having an $ABO_3$ type perovskite structure containing K, Na, and Nb", and is not limited to only the composite oxide having the $ABO_3$ type perovskite structure containing K, Na, and Nb. That is, in the present specification, the "perovskite type composite oxide containing K, Na, and Nb" includes a piezoelectric material represented as a mixed crystal containing a composite oxide having the $ABO_3$ type perovskite structure containing K, Na, and Nb (for example, the KNN-based composite oxide shown above) and another composite oxide having the $ABO_3$ type perovskite structure.

The "another composite oxide" is not limited within the scope of the embodiment, and is preferably a non-lead-based piezoelectric material that does not contain lead (Pb). The "another composite oxide" is more preferably a non-lead-based piezoelectric material which does not contain lead (Pb) or bismuth (Bi). According to these, the piezoelectric element 300 is excellent in biocompatibility and has low environmental load.

The second electrode 80 is provided on the piezoelectric layer 70. Further, the second electrode 80 may be provided on a side surface of the piezoelectric layer 70 and on the substrate 10 (or the vibration plate 50) as long as the second electrode 80 is electrically separated from the first electrode 60.

A shape of the second electrode 80 is, for example, a layered shape. A thickness of the second electrode 80 is, for example, 10 nm or more and 500 nm or less. The second electrode 80 is, for example, a metal layer such as a platinum (Pt) layer, a gold (Au) layer, an iridium (Ir) layer, or a ruthenium (Ru) layer, a conductive oxide layer thereof, a lanthanum nickelate layer, or a strontium ruthenate layer. The second electrode 80 may have a structure in which the plurality of layers exemplified above are stacked. A material of the first electrode 60 and a material of the second electrode 80 may be the same or different.

The second electrode 80 is the other electrode for applying the voltage to the piezoelectric layer 70. The second electrode 80 functions as an upper electrode provided on the piezoelectric layer 70.

The seed layer 90 is provided on the first electrode 60 and the substrate 10. The seed layer 90 is disposed between the first electrode 60 and the piezoelectric layer 70. As shown in FIGS. 5 and 6, the seed layer 90 is provided in a region same as the piezoelectric layer 70 in a plan view. The seed layer 90 may be disposed between the first electrode 60 and the piezoelectric layer 70, and may be disposed in a region different from the piezoelectric layer 70 in a plan view.

The seed layer 90 is made of an oxide containing titanium (Ti) as a constituent element. More preferably, the seed layer 90 is made of a composite oxide having a perovskite structure containing iron (Fe), titanium (Ti), and lead (Pb) as constituent elements. By providing the piezoelectric layer 70 on the seed layer 90, the composite oxide constituting the piezoelectric layer 70 can be preferentially oriented in a (100) direction. That is, the seed layer 90 in the embodiment functions as an orientation control layer capable of controlling the piezoelectric layer 70 to be preferentially oriented in the (100) direction.

The composite oxide contained in the seed layer 90 is, for example, a solid solution of $PbFeO_3$ and $PbTiO_3$, and is represented by $Pb(Fe,Ti)O_3$. More specifically, the composite oxide is represented by the following formula (2).

$$Pb_xFe_yTi_{(1-y)}O_z \qquad (2)$$

Here, it is sufficient that x in formula (2) satisfies a relationship of $1.00 \le x < 2.00$, but from the viewpoint of suitably attaining an effect of increasing an orientation degree of the piezoelectric layer 70 by the seed layer 90, x preferably satisfies a relationship of $1.00 \le x < 1.50$, preferably satisfies a relationship of $1.10 \le x < 1.40$.

It is sufficient that y in formula (2) satisfies a relationship of $0.10 \le x \le 0.90$, but from the viewpoint of suitably attaining the effect of increasing the orientation degree of the piezoelectric layer 70 by the seed layer 90, y preferably satisfies a relationship of $0.20 \le x \le 0.80$, and more preferably satisfies a relationship of $0.40 \le x \le 0.60$.

In formula (2), z typically satisfies a relationship of $z=3.00$. However, z may not satisfy the relationship.

From the viewpoint of suitably attaining the effect of increasing a (100) orientation degree of the piezoelectric layer 70 by the seed layer 90, x and y in formula (2) preferably satisfy a relationship of $1.3 \le (x/y) < 13.0$, more preferably satisfy a relationship of $1.5 \le (x/y) < 6.5$, and still more preferably satisfy a relationship of $1.6 \le (x/y) < 3.5$.

The constituent material of the seed layer 90 is preferably a composite oxide having a perovskite structure containing lead, iron, and titanium as constituent elements. However, the constituent material of the seed layer 90 is not limited to the composite oxide represented by the above formula (2), and elements other than lead, iron, and titanium may be contained as the constituent elements. For example, the seed layer 90 may be a composite oxide further containing Bi (bismuth) in addition to lead, iron, and titanium. The seed layer 90 may contain a small amount of other elements such as impurities.

When such a piezoelectric layer 70 is analyzed by X ray diffraction, a peak intensity corresponding to (100) is higher than a peak intensity corresponding to (110). That is, a (100) orientation degree is higher than a (110) orientation degree. Therefore, the piezoelectric element 300 having excellent displacement efficiency can be implemented.

A thickness T1 of the seed layer 90 is not particularly limited as long as the orientation degree of the piezoelectric layer 70 in the (100) direction can be increased, and is preferably smaller than a thickness T2 of the piezoelectric layer 70. In this case, the displacement efficiency of the piezoelectric element 300 can be increased as compared with a configuration in which the thickness T1 of the seed layer 90 is larger than the thickness T2 of the piezoelectric layer 70.

The thickness T1 of the seed layer 90 is preferably in a range of 20 nm to 200 nm, more preferably in a range of 50 nm to 150 nm, and still more preferably in a range of 70 nm to 130 nm. When the thickness T1 of the seed layer 90 is within the above ranges, the composite oxide constituting the piezoelectric layer 70 can be preferentially oriented in the (100) direction using the seed layer 90 while increasing the displacement efficiency of the piezoelectric element 300.

On the other hand, if the thickness T1 of the seed layer 90 is too small, the effect of increasing the orientation degree of the piezoelectric layer 70 by the seed layer 90 tends to decrease. If the thickness T1 of the seed layer 90 is excessively thin, the second adhesion layer **56*b* may penetrate the seed layer 90 and be exposed to the piezoelectric layer 70. On the other hand, if the thickness T1 of the seed layer 90 is too large, not only the seed layer 90 cannot improve the effect of increasing the (100) orientation degree of the piezoelectric layer 70, but also the thickness T2 of the piezoelectric layer 70 tends to reduce the displacement efficiency of the piezoelectric element 300**.

In the piezoelectric element 300 according to the embodiment, the conductive oxide layer 57 containing iridium is preferably provided between the first electrode 60 and the piezoelectric layer 70. The conductive oxide layer 57 has a function of controlling orientation of crystals of a piezoelectric body constituting the piezoelectric layer 70. That is, by providing the seed layer 90 on the first electrode 60 via the conductive oxide layer 57, crystals of the piezoelectric body constituting the piezoelectric layer 70 can be preferentially oriented in the (100) plane. By increasing crystal orientation of the piezoelectric layer 70, it is possible to efficiently utilize domain rotation improve displacement and characteristics. Examples of the constituent material of the conductive oxide layer 57 include, in addition to iridium, various metals such as titanium, nickel, iridium, and platinum, oxides thereof, and compounds containing bismuth, iron, titanium, and lead.

By providing the conductive oxide layer 57 containing iridium between the first electrode 60 and the piezoelectric layer 70, diffusion of the alkali metal contained in the piezoelectric layer 70 to the first electrode 60 side can be further reduced. From such a viewpoint, the conductive oxide layer 57 more preferably contains iridium oxide ($IrO_2$). The conductive oxide layer 57 may contain only iridium oxide ($IrO_2$).

Characteristics and operations of the piezoelectric element 300 according to the embodiment described above will be described below in comparison with a structure in the related art.

In a peripheral structure around the first electrode and the adhesion layer, part of titanium constituting the adhesion layer diffuses into a first electrode layer at the time of forming the piezoelectric layer (particularly, at the time of annealing in an oxidizing atmosphere). In particular, in a lower region of the end portions of the first electrode, where the adhesion layer is likely to diffuse, since the adhesion layer itself is reduced due to the diffusion, the peeling of the first electrode occurs. In particular, such a problem is remarkable when the adhesion layer is relatively thin. Therefore, in the related art, studies are made to prevent the peeling of the first electrode by designing the adhesion layer to be thick. However, when the adhesion layer is thick, at the time of forming the piezoelectric layer (particularly, at the time of annealing in the oxidizing atmosphere), part of titanium constituting the adhesion layer may be diffused to an interface between the first electrode and a conductor layer (for example, an iridium electrode) provided on the first electrode, and a titanium oxide layer may be formed at the interface. Further, when the thickness of the titanium oxide layer is increased, the conductor layer may be peeled off.

On the other hand, the piezoelectric element 300 according to the embodiment includes the first adhesion layer 56*a* containing titanium, and the second adhesion layer 56*b* containing titanium oxide and provided below at least a part of the end portion of the first electrode 60. Accordingly, diffusion of titanium constituting the first adhesion layer 56*a* can be reduced, and the peeling of the first electrode 60 can be prevented. By providing the second adhesion layer 56*b* below the end portion of the first electrode 60, it is possible to reduce the diffusion of titanium into the periphery of the end portion of the first electrode 60 by the second adhesion layer 56*b* while ensuring the adhesion of the first electrode 60 to the vibration plate 50 by the first adhesion layer 56*a*. That is, instead of using titanium oxide for the entire adhesion layer, the first adhesion layer 56*a* containing metallic titanium and the second adhesion layer 56*b* containing titanium oxide are appropriately disposed according to the required characteristics. Therefore, both improvement in adhesion and prevention of the peeling of the first electrode can be achieved.

By providing the second adhesion layer 56*b* containing titanium oxide below the end portion of the first electrode 60, when the KNN-based material is applied as the piezoelectric layer 70, the diffusion of titanium to the piezoelectric layer 70 side can be reduced. Therefore, the deterioration in the crystal orientation of the KNN can be prevented.

In the above embodiment, the liquid droplet dispensing head is described as an example of a liquid ejection head. However, the present disclosure is applicable to liquid ejection heads in general, and is also applicable to a liquid ejection head for ejecting a liquid other than the ink. Examples of other liquid ejection heads include various recording heads used in image recording devices such as printers, color material ejection heads used for manufacturing color filters for liquid crystal displays, and the like, electrode material ejection heads used for forming electrodes for organic EL displays, field emission displays (FEDs), and the like, and bioorganic material ejection heads used for manufacturing biochips.

The present disclosure is not limited to the piezoelectric element mounted on the liquid ejection head, and can also be applied to a piezoelectric element mounted on another piezoelectric element application device. Examples of the piezoelectric element application device include an ultrasonic device, a motor, a pressure sensor, a pyroelectric element, and a ferroelectric element. Completed bodies using these piezoelectric element application devices, for example, an ejection device of a liquid or the like using an ejection head for the liquid or the like, an ultrasonic sensor using the ultrasonic device, a robot using the motor as a driving source, an IR sensor using the pyroelectric element, and a ferroelectric memory using the ferroelectric element are also included in the piezoelectric element application device.

Method for Manufacturing Piezoelectric Element

Next, an example of a method for manufacturing the piezoelectric element 300 will be described.

First, a substrate containing silicon is prepared, and by thermally oxidizing the substrate, the elastic film 51 made of silicon dioxide is formed at a surface of the substrate.

Next, a zirconium film is formed on the elastic film 51 by a sputtering method, and the zirconium film is thermally oxidized to form the diffusion inhibition layer 52. Accordingly, the vibration plate 50 including the elastic film 51 and the diffusion inhibition layer 52 is obtained.

Next, a metallic titanium film is formed on the vibration plate 50 by a method in the related art (a sputtering method, a vapor deposition method, or the like), and the first electrode 60 and the conductive oxide layer 57 are formed thereon in this order.

Next, the metallic titanium film, the first electrode 60, and the conductive oxide layer 57 are patterned. Patterning is performed by, for example, photolithography and etching. By the patterning, an upper surface of the substrate, the metallic titanium film, a side surface of the first electrode 60, and a side surface of the conductive oxide layer 57 are exposed.

Next, metal organic decomposition (MOD) solutions of bismuth, lead, iron, and titanium are applied onto the substrate and the conductive oxide layer by a spin coating method, and then drying and degreasing are performed in a temperature range of 150° C. to 400° C.

Thereafter, the seed layer 90 is formed by performing a rapid thermal annealing (RTA) treatment under conditions of 500° C. to 750° C. and 2 minutes to 5 minutes. At this time, the heat treatment is preferably performed in an oxidizing atmosphere of $O_2$ gas being 50 sccm to 200 Sccm. By forming the seed layer 90 under the above conditions, titanium contained in the solution and a part of the metallic titanium film are oxidized, and the second adhesion layer 56*b* containing titanium oxide is formed below the end portion of the first electrode 60. At this time, it is considered that titanium contained in the solution and a part of titanium constituting the metallic titanium film are aggregated and oxidized below the end portion of the first electrode 60 to form the second adhesion layer 56*b*.

Next, a plurality of piezoelectric films is formed so as to cover the seed layer 90.

The piezoelectric layer 70 is implemented by the plurality of layers of piezoelectric films. The piezoelectric layer 70 can be formed by a solution method (a chemical solution method) such as a MOD method or a sol-gel method. Productivity of the piezoelectric layer 70 can be increased by forming the piezoelectric layer 70 by the solution method. The piezoelectric layer 70 formed by the solution method is formed by repeating a series of steps from a step of applying the precursor solution (an applying step) to a step of firing the precursor film (a firing step) a plurality of times.

A specific procedure for forming the piezoelectric layer 70 by the solution method is, for example, as follows.

First, a precursor solution containing a predetermined metal complex is prepared. The precursor solution is obtained by, in an organic solvent, dissolving or dispersing a metal complex capable of forming a composite oxide containing K, Na, and Nb by firing. At this time, a metal complex containing an additive such as Mn may be further mixed.

Examples of a metal complex containing potassium (K) include potassium 2-ethylhexanoate and potassium acetate. Examples of a metal complex containing Na include sodium 2-ethylhexanoate and sodium acetate. Examples of a metal complex containing Nb include niobium 2-ethylhexanoate and pentaethoxyniobium. When Mn is added as the additive, examples of a metal complex containing Mn include manganese 2-ethylhexanoate. At this time, two or more kinds of metal complexes may be used in combination. For example, potassium 2-ethylhexanoate and potassium acetate may be used in combination as the metal complex containing K. Examples of a solvent include 2-n-butoxyethanol, n-octane, and mixed solvents thereof. The precursor solution may contain an additive which stabilizes dispersion of the metal complex containing K, Na, and Nb. Examples of such an additive include 2-ethylhexanoic acid.

Further, the precursor solution is applied onto the seed layer 90 to form a precursor film (an applying step).

Next, the precursor film is heated at a predetermined temperature, for example, about 130° C. to 250° C. and is dried for a certain period of time (a drying step).

Next, the dried precursor film is heated to a predetermined temperature, for example, 250° C. to 500° C., and is held at this temperature for a certain period of time to perform degreasing (a degreasing step).

Examples of a heating device used in the drying step, the degreasing step, and the firing step include a RTA device which performs heating by irradiation with an infrared lamp, and a hot plate. The above steps are repeated a plurality of times to form the piezoelectric layer 70 including a plurality of layers of piezoelectric films. In the series of steps from the applying step to the firing step, the firing step may be performed after repeating the steps from the applying step to the degreasing step a plurality of times.

Before and after the second electrode 80 is formed on the piezoelectric layer 70, a reheat treatment (post-annealing) may be performed in a temperature range of 600° C. to 800° C. as necessary.

After the firing step, the piezoelectric layer 70 implemented with a plurality of piezoelectric films is patterned into a shape as shown in FIG. 5. Patterning can be performed by dry etching such as reactive ion etching or ion milling, or wet etching using an etchant.

Thereafter, the second electrode 80 is formed on the piezoelectric layer 70. The second electrode 80 can be formed by a similar method as the first electrode 60.

Through the above steps, the piezoelectric element 300 is manufactured.

In the step of forming the seed layer 90, in an annealing treatment in the oxidizing atmosphere after the MOD solutions of bismuth, lead, iron, and titanium are applied, it is considered that the oxidation of the metallic titanium film located below the end portion of the electrode is preferentially performed. That is, according to the manufacturing method in the embodiment described above, it is considered that a degree of diffusion and oxidation of titanium to an interface between first electrode 60 and conductive oxide layer 57 can be reduced, and peeling of first electrode 60 and conductive oxide layer 57 can be prevented.

What is claimed is:

1. A piezoelectric element comprising:
- a substrate;
- a first adhesion layer formed on the substrate and containing titanium;
- at least one of second adhesion layers formed on the substrate and containing titanium oxide;
- a first electrode formed on the first adhesion layer and the second adhesion layer;
- a seed layer formed on the first electrode and the substrate and containing titanium;
- a piezoelectric layer formed on the seed layer; and
- a second electrode formed on the piezoelectric layer, wherein
- at least a part of an end portion of the first electrode is formed on the second adhesion layer.

2. The piezoelectric element according to claim 1, wherein
- an average thickness of the first adhesion layer is smaller than a maximum thickness of the second adhesion layer.

3. The piezoelectric element according to claim 1, wherein
- a width of the first adhesion layer is larger than a total value of widths of the second adhesion layers.

4. The piezoelectric element according to claim 1, wherein
- an average thickness of the first adhesion layer is 20 nm or more and 100 nm or less.

5. The piezoelectric element according to claim 1, wherein
- the first electrode contains platinum or gold.

6. The piezoelectric element according to claim 1, wherein
- a conductive oxide layer containing iridium is disposed between the first electrode and the piezoelectric layer.

7. The piezoelectric element according to claim 1, wherein
- the piezoelectric layer contains potassium, sodium, and niobium.

8. A liquid droplet dispensing head comprising:
- a nozzle plate in which a nozzle configured to dispense a liquid as a liquid droplet is formed;
- a pressure chamber coupled to the nozzle;
- a flow path forming substrate disposed on the nozzle plate and forming a part of a wall surface of the pressure chamber;
- a vibration plate forming a part of the wall surface of the pressure chamber;
- the piezoelectric element according to claim 1 or 2 formed on the vibration plate; and
- a voltage application unit configured to apply a voltage to the piezoelectric element, wherein
- a plurality of the piezoelectric elements are provided on the substrate.

* * * * *